under 35 U.S.C. 154(b) by 0 days.

(12) United States Patent
Ro (10) Patent No.: US 8,274,144 B2
(45) Date of Patent: Sep. 25, 2012

(54) HELICAL SPRINGS ELECTRICAL CONNECTING A PLURALITY OF PACKAGES

(75) Inventor: Young-Hoon Ro, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/114,073

(22) Filed: May 24, 2011

(65) Prior Publication Data

US 2012/0049348 A1    Mar. 1, 2012

(30) Foreign Application Priority Data

Aug. 31, 2010    (KR) .................. 10-2010-0084960

(51) Int. Cl.
*H01L 23/02* (2006.01)
*H01L 21/00* (2006.01)

(52) U.S. Cl. .............. 257/686; 257/698; 257/E23.172; 257/E25.006; 257/E25.013; 438/117

(58) Field of Classification Search .................. None
See application file for complete search history.

(56) References Cited

U.S. PATENT DOCUMENTS

| 8,044,494 | B2* | 10/2011 | Mistry et al. | 257/659 |
| 2005/0121764 | A1* | 6/2005 | Mallik et al. | 257/686 |
| 2007/0141751 | A1* | 6/2007 | Mistry et al. | 438/109 |
| 2008/0108179 | A1* | 5/2008 | Mistry et al. | 438/117 |
| 2008/0230887 | A1* | 9/2008 | Sun et al. | 257/686 |
| 2010/0013065 | A1* | 1/2010 | Mistry et al. | 257/660 |

FOREIGN PATENT DOCUMENTS

| JP | 2007-194436 | 8/2007 |
| JP | 2009-081174 | 4/2009 |
| JP | 2010-080609 | 4/2010 |

* cited by examiner

*Primary Examiner* — Alonzo Chambliss
(74) *Attorney, Agent, or Firm* — Volentine & Whitt, PLLC

(57) ABSTRACT

A first semiconductor package includes a first substrate, a first semiconductor chip attached to the first substrate, an encapsulant which covers the first semiconductor chip, and conductive elastic members which are embedded in the encapsulant but with parts thereof exposed. A package on package (POP) includes the first semiconductor package and a second semiconductor package stacked in the first semiconductor package. The second semiconductor package includes a second substrate and a second semiconductor chip attached to the second substrate. The exposed parts of the elastic members are electrically connected to the second substrate. The encapsulant of the first package is formed by a molding process while the conductive elastic members are compressed within their elastic limit by the mold.

14 Claims, 8 Drawing Sheets

HELICAL SPRINGS ELECTRICAL CONNECTING A PLURALITY OF PACKAGES

CROSS-REFERENCE TO RELATED APPLICATION(S)

This application claims priority from Korean Patent Application No. 10-2010-0084960 filed on Aug. 31, 2010 in the Korean Intellectual Property Office.

BACKGROUND

The inventive concept relates to semiconductor devices. More particularly, the inventive concept relates to a package on package in which several semiconductor packages are stacked one atop the other.

Many of today's compact electronic devices require a high capacity to store data, for example, and an ability to perform many different functions. There are constant market demands to increase the functionality and capacity of these devices while keeping these devices highly compact or even miniaturizing these devices. To meet these demands, a system in package (SiP) has been suggested. An SiP is a semiconductor package in which a number of integrated circuits are stacked. Thus, the SIP is rendered extremely compact but the combination of the integrated circuits provides the device with a high capacity and an ability to perform multiple functions.

SIPs are being produced largely in two types: one is a multi-chip package (MCP) in which a number of semiconductor chips or dies are stacked, and the other is a package on package (POP) in which a number of individual semiconductor packages which have been separately assembled and electrically tested are stacked.

In the case of POPs, bumps of conductive material have been used to physically and electrically connect the stacked packages. However, it is difficult to stack an upper package on a lower package using such bumps because the bumps can not be fabricated tall enough to physically connect the packages while allowing for a pitch that is small enough to provide for the requisite number of electrical interconnections. For this reason, a through mold via (TMV) method has been developed in which the bottom package is provided with a mold layer encapsulating a chip, holes are formed in the encapsulant, and the holes are filled with conductive material that form via plugs constituting the physical and electrical interconnections. In the TMV method, however, the holes must be formed using a laser or a drill after the mold layer has been formed. Consequently, the TMV process used in fabricating a POP is relatively complex and time consuming and thus limits the productivity of the POP manufacturing process.

SUMMARY

According to an aspect of the inventive concept there is provided a semiconductor chip package including a first substrate, a first semiconductor chip attached to the first substrate and electrically connected to the first conductive elements, an encapsulant which covers the first semiconductor chip, and conductive elastic members which are embedded in the encapsulant. Each of the elastic members has a part exposed by the encapsulant and electrically connected to respective ones the conductive elements. The conductive elastic members are electrically connected to the first substrate. That is, the first substrate has a first insulating substructure and conductive elements integral with the first insulating substructure, and the conductive elastic members are electrically connected to respective ones of the conductive elements.

According to an aspect of the present invention, there is provided a POP having a first package and a second package stacked on the first package, and in which the first package includes a first substrate, a first chip attached to the first substrate, an encapsulant for the first chip, and conductive elastic members embedded in and extending through the encapsulant so that part of each of the elastic members is exposed by the encapsulant, and in which the second package is electrically connected to the elastic conductive members.

The substrate of the first package has a first insulating substructure and first conductive elements integral with the first insulating substructure, and the first semiconductor chip is electrically connected to respective ones of the first conductive elements. The second package comprises a second substrate, and a second semiconductor chip attached to the second substrate. The second substrate has a second insulating substructure and second conductive elements integral with the second insulating substructure, and the second semiconductor chip is electrically connected to respective ones of the second conductive elements. Each of the conductive elastic members is electrically connected to at least one each of the first and second conductive elements.

According to an aspect of the present invention, there is provided a method of fabricating a semiconductor package in which elastic conductive members are formed as vias in a chip encapsulant. A first substrate is provided having an upper surface and a lower surface, and first conductive elements, and wherein a chip is attached to the upper surface and respective ones of the conductive elements are located at the upper surface. The elastic conductive elastic members are electrically connected to the respective ones of the conductive elements at the upper surface of the first substrate with the elastic members projecting from the first substrate. Subsequently, the chip and the elastic members are embedded on the upper surface of the substrate in an encapsulant that seals the chip and exposes a part of each of the elastic members.

BRIEF DESCRIPTION OF THE DRAWINGS

The above and other aspects and features of the inventive concept will become more apparent by referring to the preferred embodiments thereof made with reference to the attached drawings, in which.

DETAILED DESCRIPTION OF THE EMBODIMENTS

Various embodiments and examples of embodiments of the inventive concept will be described more fully hereinafter with reference to the accompanying drawings. In the drawings, the sizes and relative sizes and shapes of elements and layers shown in section may be exaggerated for clarity. In particular, the cross-sectional illustrations of the packages and intermediate structures fabricated during the course of their manufacture are schematic. Also, like numerals are used to designate like elements throughout the drawings.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "upper" or "bottom" as used to describe a surface generally refer not only to the orientation depicted in the drawings but to the fact that the surface is the uppermost or bottommost surface in the orientation depicted, as would be clear from the drawings and context of the written description.

It will also be understood that when an element or layer is referred to as being "on" another element or layer, it can be directly on the other element or layer or intervening elements or layers may be present. In contrast, when an element or layer is referred to as being "directly on" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. Also, the term "attached" will generally refer to a physical interconnection, whereas the term "connected" generally refers to an electrical connection. However, the exact meanings of the terms "attached" and "connected" will be clear in the context in which they are used and from the drawings.

Hereinafter, an embodiment of a package on package (POP) according to the inventive concept will be described with reference to FIGS. 1 through 5C.

Figure 1:
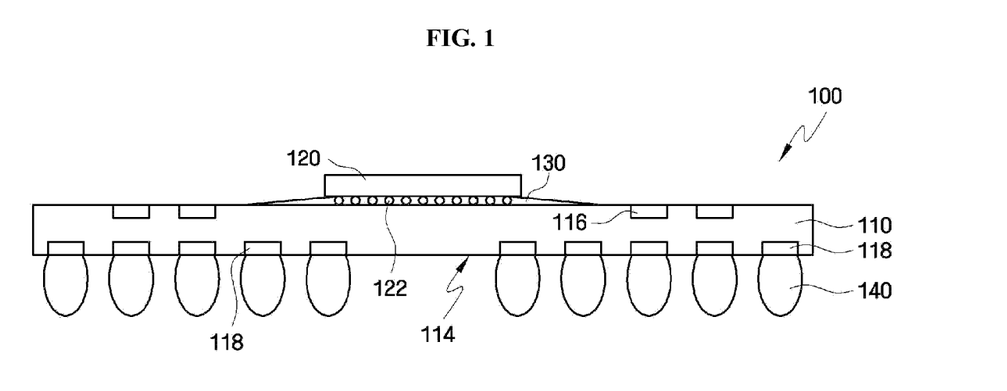
FIG. 1 is a cross-sectional view of a semiconductor package that may be used as an upper package in a POP according to the inventive concept.

Referring first to FIG. 1, a lower package 100 of the POP includes a substrate 110, a semiconductor chip 120, encapsulating material (encapsulant) 130, a plurality of conductive chip bumps 122, and a plurality of conductive bumps 140.

The substrate 110 has an insulating substructure, an upper surface 112 and a lower surface 114 which are opposite each other. The substrate 110 may be a printed circuit board (PCB). Thus, the substrate 110 also includes conductive elements some of which are referred to in more detail below but which may also include wiring patterns and/or vias extending vertically through the insulating substructure. The exact structure of the substrate 110 will depend on the application of the POP.

The semiconductor chip 120 is attached to a central region of the substrate 110, and the peripheral region of the substrate 110 is used to connect the lower package 100 and an upper package 200 (FIG. 2, for example) as will be described in more detail later.

In this example of the lower package 100, a plurality of connection pads 116 and 118 (i.e., pads of conductive material) of the substrate 110 are disposed at the upper and lower surfaces 112 and 114 of the substrate 110, respectively. In particular, the connection pads 116 are disposed at the peripheral region of the upper surface 112 of the substrate 110 and are used to electrically connect the lower package 100 to the upper package 200. The connection pads 116 are disposed at locations corresponding to those of a plurality of bumps 240 of the upper package 200 (see FIG. 3), respectively.

The semiconductor chip 120 may be attached to the central region of the upper surface 112 of the substrate 100 by adhesive such as liquid epoxy resin or an adhesive tape. As shown in the drawing, the semiconductor chip 120 may have chip bumps 122. In this case, the chip bumps 122 correspond to input/output (I/O) pads (not shown) of the semiconductor chip 120. More specifically, in this example of the lower package 100, the semiconductor chip 120 is physically attached to the substrate 110 at the central region of the upper surface 112 of the substrate, and is electrically connected to (the conductive elements of) the substrate 110 by the chip bumps 122.

The encapsulating material 130 fills the space between the semiconductor chip 120 and the substrate 110, thereby protecting the chip bumps 122 and increasing the adhesion between the semiconductor chip 120 and the substrate 110. However, the encapsulating material 130 may be omitted. Instead, chip encapsulant 310 (see FIG. 3), which will be described in more detail later, covers the semiconductor chip 120 and the chip bumps 122 and fills the space between the semiconductor chip 120 and the substrate 110.

In the current example, too, the lower package 100 includes one semiconductor chip 120. However, the inventive concept is not so limited. Rather, the lower package 100 may include one or more additional semiconductor chips (not shown) stacked on the semiconductor chip 120.

Referring again to FIG. 1 showing an example of the lower package, the bumps 140 are attached to the lower surface 114 of the substrate 110, particularly, to the connection pads 118 disposed at the lower surface 114 of the substrate 110 and are electrically connected to the semiconductor chip 120. The bumps 140 may be electrically connected to a motherboard (not shown) disposed under the lower package 100 or to another semiconductor package (not shown). That is, the bumps 140 constitute external terminals of the POP. It should be noted, however, that the lower package 100 may thus employ various other types of external terminals or connections instead of the bumps 140.

Figure 2:
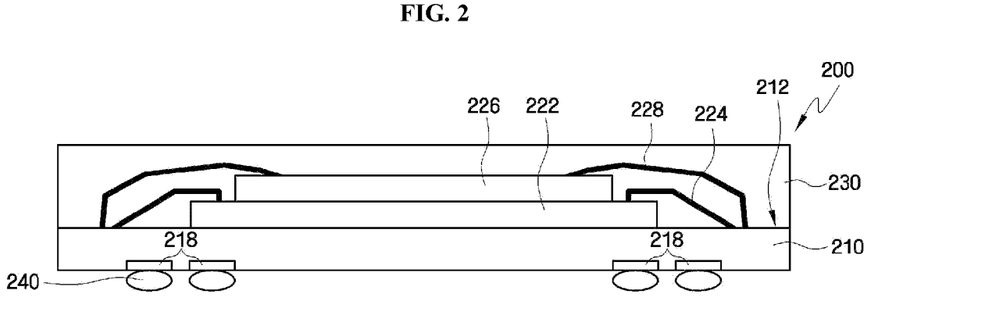
FIG. 2 is a cross-sectional view of a first version of semiconductor package used as a lower package in a POP according to the inventive concept.

Referring to FIG. 2, the upper package 200, according to an embodiment of a POP according to the inventive concept, includes a substrate 210, semiconductor chips 222 and 226, encapsulating material 230, and conductive bumps 240. However, the upper package is not limited to having only two semiconductor chips. Rather, the upper package 200 may have only one semiconductor chip or three or more stacked semiconductor chips.

The substrate 210, like the substrate 110, comprises an insulating substructure and conductive elements (at least some of which are referred to below) integral with the insulating substructure. Thus, the substrate 210 has an upper surface 212 and a lower surface 214 which are opposite each other and may be a PCB . The substrate 210 may be approximately the same size, at least in terms of surface area, as the substrate 110 of the lower package 100. Accordingly, the semiconductor chip 120 of the lower package 100 may be located under the central region of the lower surface 214 of the substrate 210, and the peripheral region of the lower surface 214 of the substrate 210 may be used to connect the upper package 200 to the lower package 100.

In addition, in this example of the upper package 200, a plurality of connection pads 218 are disposed at the peripheral region of the lower surface 214 of the substrate 210. The connection pads 218 are disposed at locations corresponding to those of the connection pads 116 of the lower package 100, respectively, to facilitate the connecting of the upper package 200 to the lower package 100, as will be clearer from the description that follows.

The lower semiconductor chip 222 and the upper semiconductor chip 226 may be stacked one atop the other on the upper surface 212 of the substrate 210. Specifically, in this case, the lower semiconductor chip 222 is attached to the substrate 210, at the central region of the upper surface 212 of the substrate 210, by adhesive. Furthermore, the lower semiconductor chip 222 may be electrically connected by wires 224 to conductive pads (not shown) at the upper surface 212 of the substrate 210. On the other hand, the upper semiconductor chip 226 is attached to the lower semiconductor chip 222, at the upper surface of the lower semiconductor chip 222, by adhesive. Furthermore, the upper semiconductor chip 226 may be electrically connected by wires 218 to the pads (not shown) at the upper surface 212 of the substrate 210.

In this example of the upper package 200, the encapsulating material 230 covers the semiconductor chips 222 and 226 and the wires 224 and 228 on the upper surface 212 of the substrate 210, thereby sealing the semiconductor chips 222 and 226 and the wires 224 and 228 by encapsulating them. Furthermore, the encapsulating material 230 is formed on the entire upper surface 212 of the substrate 210 but the inventive concept is not so limited. Rather, the encapsulating material 230 may instead occupy only part of the upper surface 212 of the substrate 210 while covering the semiconductor chips 222 and 226 and the wires 224 and 228.

The conductive bumps 240 are attached to the connection pads 218, respectively and are thereby electrically connected to the semiconductor chips 222 and 226. Instead of the bumps 240, though, various other forms of conductors can be used for the same purposes.

Figure 3:
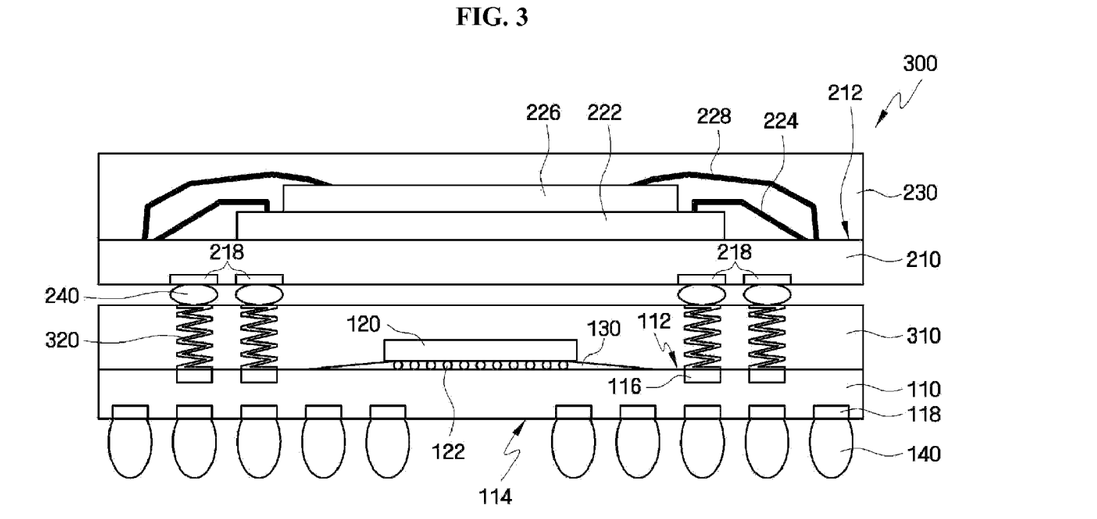
FIG. 3 is a cross-sectional view of embodiment of a package on package (POP) according to the inventive concept, in which a package of the type shown in FIG. 2 is stacked on a package of the version shown in FIG. 1.

Referring to FIG. 3, the POP 300 includes the lower package 100, and the upper package 200 stacked on the lower package. The lower package 100 includes the chip encapsulant 310, and conductive elastic members 320 which extend within the chip encapsulant 310. The chip encapsulant 310 covers the semiconductor chip 120 regardless of whether the encapsulating material 1130 is employed (refer to the above). Nonetheless, part of each of the elastic members 320 is exposed by the encapsulant 310.

More specifically, lower ends of the conductive elastic members 320 are respectively connected (physically and hence, electrically, too, in this case) to the connection pads 116 of the substrate 110, and upper ends of the elastic members 320 are also respectively connected (physically and electrically) to the bumps 240 of the upper package 200.

As described above, the connection pads 116 disposed at the upper surface 112 of the substrate 110 of the lower package 100, the connection pads 218 disposed at the lower surface 214 of the substrate 210 of the upper package 200, and the bumps 240 respectively connected to the connection pads 218 are disposed at corresponding locations. In particular, each connection pad 116 is vertically aligned with a respective bump 240 attached to a connection pad 218. Thus, the upper package 200 can be readily electrically connected to the lower package 100 to form the POP 300, as shown in the drawing.

In the embodiment of the POP 300 according to the inventive concept, the elastic members 320 are helical springs, as an example. Furthermore, the elastic members 320, even in the case in which they are helical springs, may comprise a flexible core that is plated with conductive material.

Figure 4:
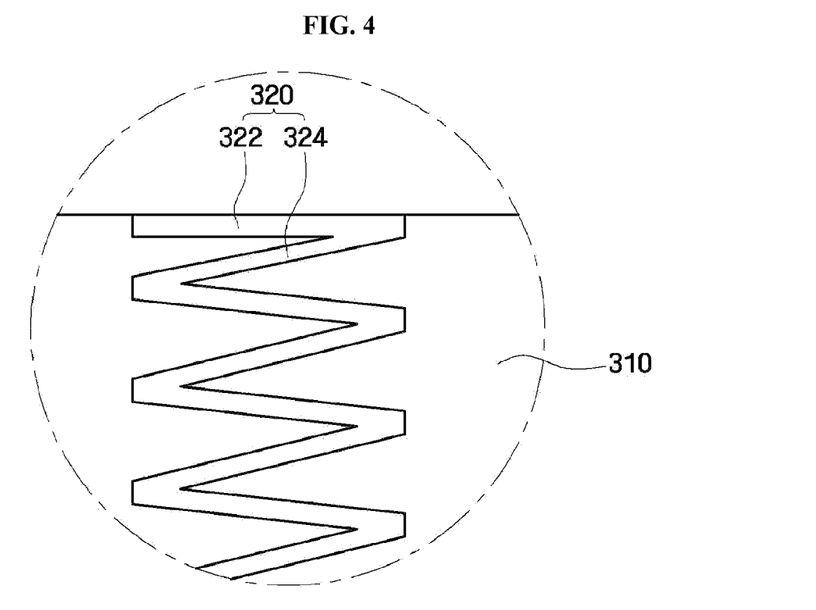
FIG. 4 is an enlarged view of a portion of the POP package shown in FIG. 3 illustrating a positional relationship between an elastic member and an encapsulant of the package.

In any case, the basic structure of the elastic members 320 will now be described with reference to FIGS. 3 and 4. Each of the elastic members 320 includes a first portion 322, which is the aforementioned part exposed by the encapsulant 310, and a second portion 324 which is embedded in the encapsulant 310. More specifically, as shown in FIG. 4, the encapsulant 310 has an upper surface which faces the upper package 200, and the first portion 322 of each of the elastic members 320 has a surface which is exposed by the encapsulant 310. The upper surface of the encapsulant 310 and the exposed surface of the first portion 322 of each of the elastic members 320 may be substantially coplanar.

In this example in which the upper package has bumps 240 as external electrical terminals, the first portion 322 of each of the elastic members 320 is electrically connected to a corresponding one of the bumps 240 of the upper package 200. In particular, each of the bumps 240 of the second package 200 contacts the first portion 322 of a corresponding one of the elastic members 320. Accordingly, the lower package 100 and the upper package 200 are electrically connected to each other by the elastic members 320 and the bumps 240.

Figure 5A:
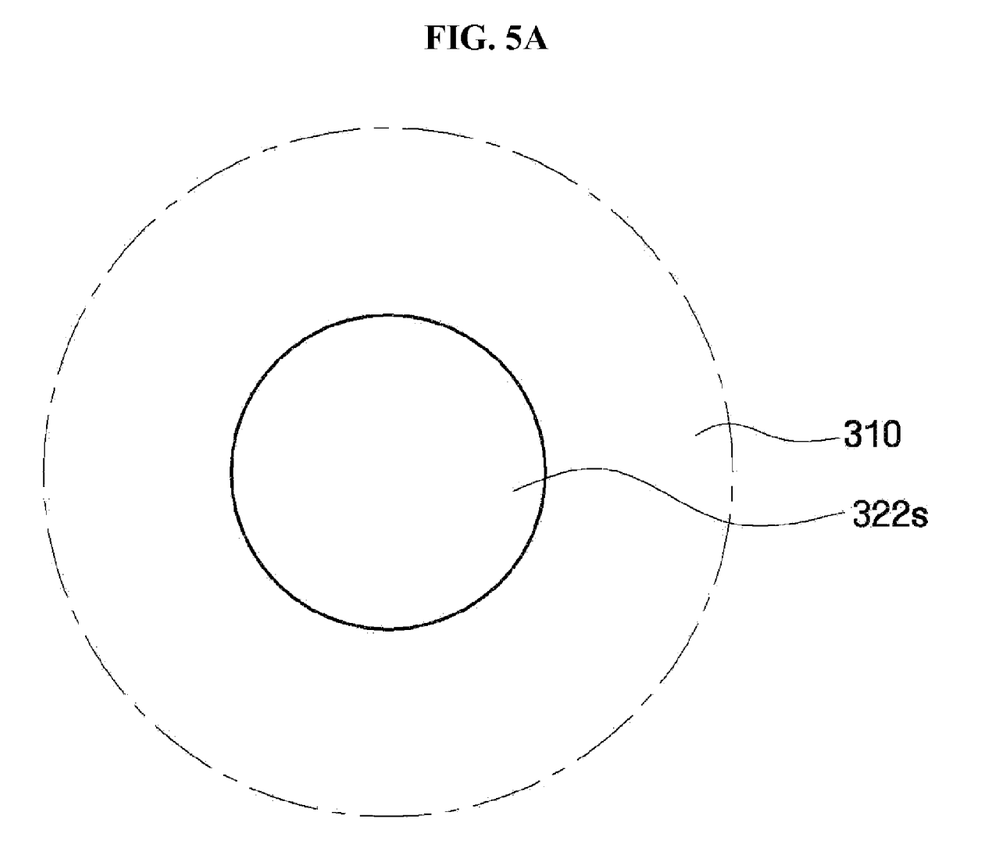
FIGS. 5A through 5C are each a plan view of an elastic member that may be used in a POP according to the inventive concept, illustrating various shapes of first portions of the elastic members, respectively.
Figure 5B:
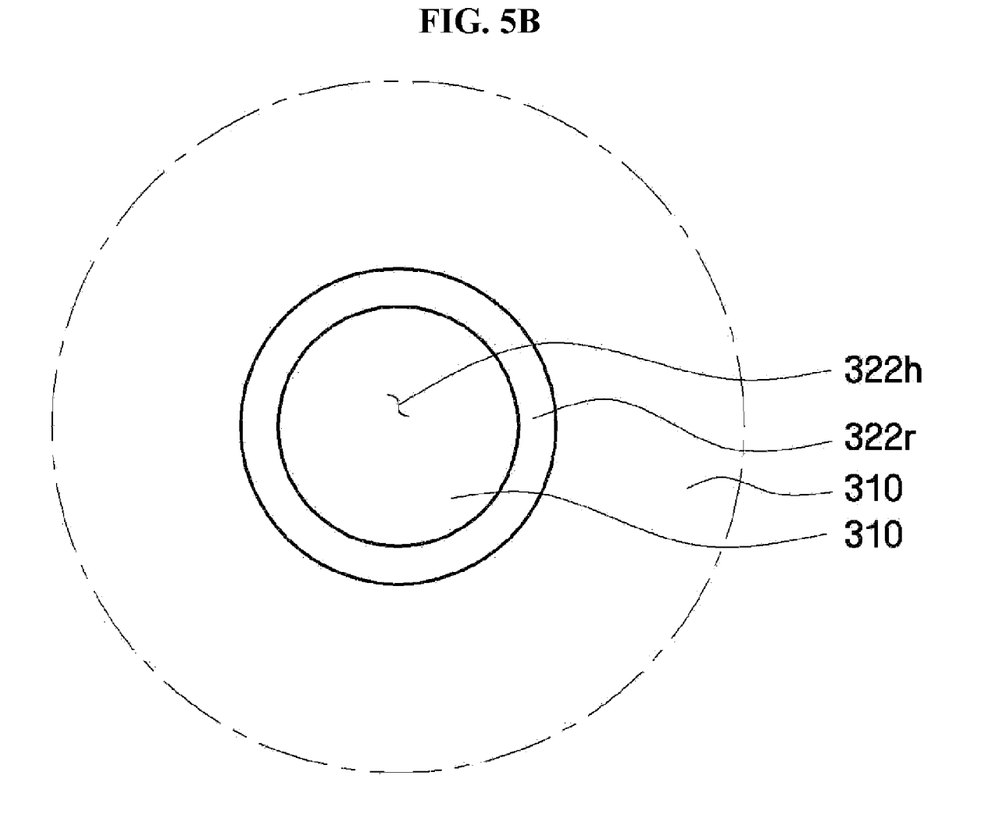
Figure 5C:
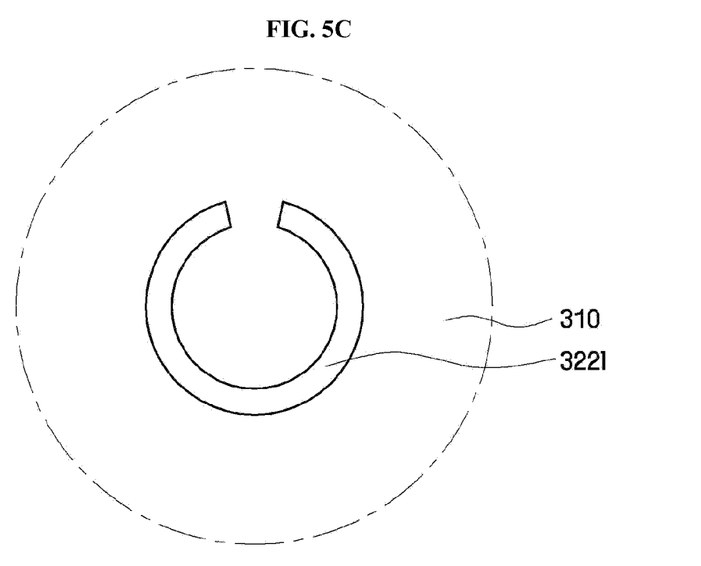

The first portion 322 of each of the elastic members 320 may have any of the shapes shown in FIGS. 5A through 5C. Basically, any of these shapes allow the first portion 322 to contact a corresponding one of the bumps 240 in a stable manner. These shapes shown in the drawings are, of course, only examples.

As shown in FIG. 5A, the first portion may be in the form of a plate 322s presenting a planar solid surface of a predetermined geometrical shape. Alternatively, referring to FIG. 5B, the first portion may be annular segment 322r so as to define a space 322h therein. In this case, the space 322h may be filled with the encapsulant 310. Referring to FIG. 5C, the first portion may be only a portion of an annulus 322l so as to define a radial opening therethrough.

Referring back to FIG. 3, the elastic members 320 may be compressed within their elastic limit and, in this compressed state, may be fixed in place by the encapsulant 310. That is, the elastic members may exert an elastic force on the encapsulant.

Hereinafter, another example of a POP 400 according to the inventive will be described with reference to FIG. 6. The POP 400 is substantially the same as the POP 300 except for some elements of the lower package. Thus, for simplicity, elements substantially identical to those of the POP 300 will be described only briefly or not at all.

Figure 6:
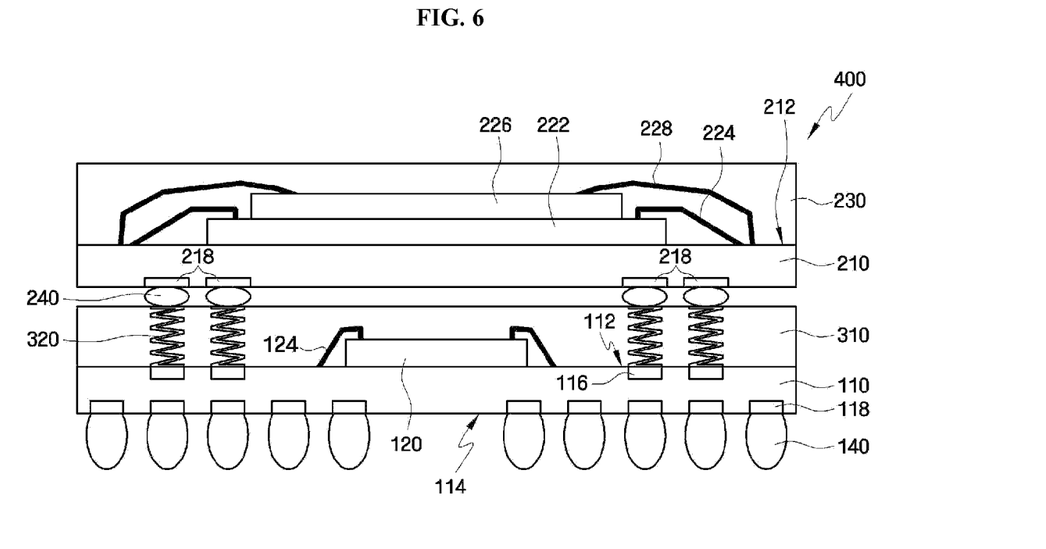
FIG. 6 is a cross-sectional view of a POP according to the inventive concept but with a different version of the lower package.

Referring to FIG. 6, the lower package of the POP 400 includes a substrate 110 which has an upper surface 112 and a lower surface 114, a plurality of connection pads 116 and 118 which are disposed at the upper and lower surfaces 112 and 114 of the substrate 110, and a plurality of chip bumps 122 which are respectively attached to the connection pads 118 of the substrate 110. In addition to these elements, the lower package includes a semiconductor chip 120 and wires 124.

The semiconductor chip 120 may be attached to a central region of the upper surface 112 of the substrate 110 by liquid epoxy resin or an adhesive tape, and the wires 124 electrically connect the semiconductor chip 120 to conductive pads (not shown) at the upper surface 112 of the substrate 110. That is, the pads (not shown) and the semiconductor chip 120 are electrically connected to each other by wire bonding in this version of the lower package.

An encapsulant 310 seals the semiconductor chip 120 and the wires 124. More specifically, the encapsulant 310 covers the semiconductor chip 120 and the wires 124. Furthermore, the encapsulant 310 exposes part of each of elastic members 320. The encapsulant 310 may be made of thermosetting resin such as an epoxy mold compound (EMC).

Hereinafter, an embodiment of a method of fabricating a POP according to the inventive concept will be described with reference to FIGS. 7 through 14. Note, a method of fabricating a POP similar to that shown in FIG. 3 will be described as an example. The methods, according to the inventive concept, of fabricating the POPs 300 and 400 shown in and described with reference to FIGS. 1-6 are similar and will be readily inferred from the description of FIGS. 7-14 by those of ordinary skill in the art to which the present invention pertains. Also, elements in FIGS. 7-14 that are substantially identical to those of FIGS. 1 through 6 are designated by like reference numerals.

Figure 7:
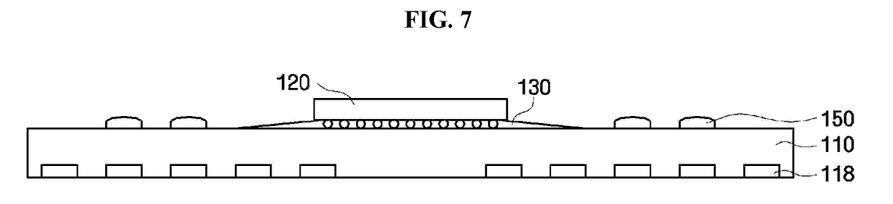
FIGS. 7 through 14 are cross-sectional views illustrating a method of fabricating a lower semiconductor package of a POP according to the inventive concept.

Referring first to FIG. 7, solder paste patterns 150 are formed on the upper surface 112 of the insulating substructure of the substrate 110 to which the semiconductor chip 120 is attached. The solder paste patterns 150 may be formed on the upper surface 112 of the substrate 110 by a screen-printing process or a dotting process. Alternatively, the upper surface 112 of the substrate 110 is provided with the connection pads 116 (see FIG. 1) as part of its printed circuitry, e.g., wiring pattern. It will thus be clear that the solder paste patterns 150 are disposed at locations corresponding to those of the connection pads 116 shown in FIG. 1. In either of these cases the solder paste patterns 150 and the connection pads 116 are conductive elements that are part of the substrate 110.

Figure 8:
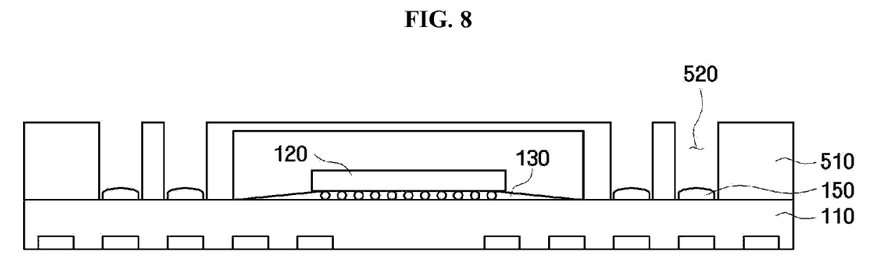

Referring to FIG. 8, a jig 510 including guide holes 520 which correspond to the solder paste patterns 150, respectively, is placed on the upper surface 112 of the substrate 110. The guide holes 520 may have shapes similar to those presented by the outer peripheries of the elastic members 320.

Figure 9:
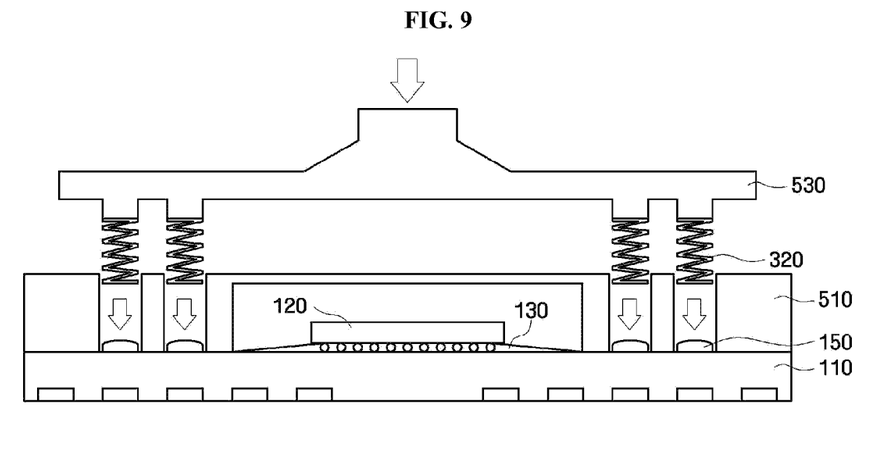

Referring to FIG. 9, the elastic members 320 are inserted into the guide holes 520 of the jig 510. More specifically, as shown in the drawing, the elastic members 320 are connected to a support 530. Then, the elastic members 320 are inserted into the guide holes 520 of the jig frame 510 by moving the support 530 and the substrate 110 relatively towards each other. In the case in which the guide holes 520 have shapes similar to those presented by the outer peripheries of the elastic members 320, the jig 510 guides the elastic members 320 onto the substrate and the elastic members 320 are supported stably on the substrate 110 while in the guide holes 520. As a result, the elastic members 320 are disposed on the solder paste patterns 150, respectively.

As described above, the elastic members 320 comprise conductive material. For example, the elastic members 320 may comprise flexible cores plated with conductive material. Furthermore, the elastic members 320 may be helical springs. Especially in these cases there is no need to perform an additional and exclusive process for improving the electrical connection between the upper package 200 and the lower package 100 before the upper package 200 is bonded to the lower package 100. Thus, the method according to the inventive concept can help to simply the overall process of fabricating POPs.

Figure 10:
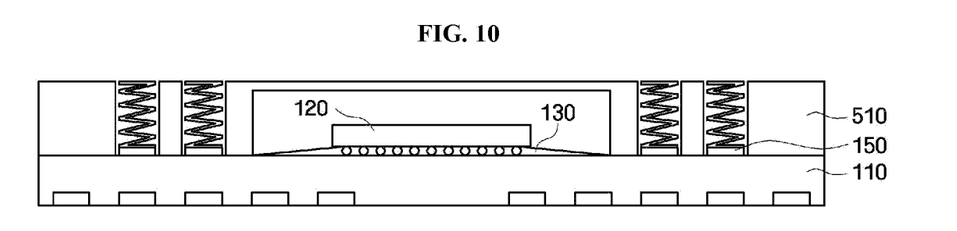

Referring to FIG. 10, the solder paste patterns 150 and the elastic members 320 are attached to each other. More specifically, a reflow process is performed to attach the solder paste patterns 150 to the elastic members 320, respectively.

Figure 11:
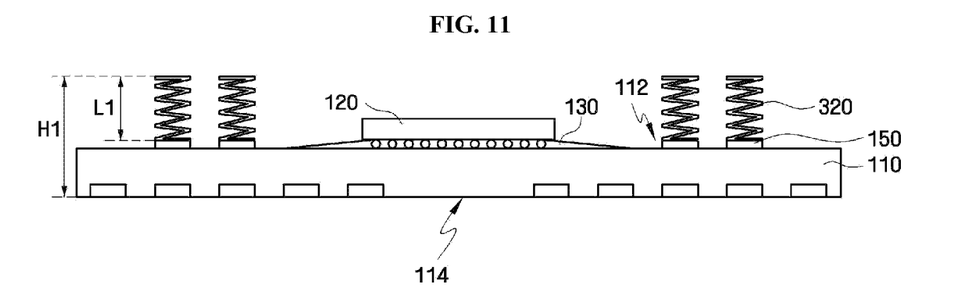

Referring to FIG. 11, the jig 510 (see FIG. 10) is removed. As shown in the drawing, the elastic members 320 have a certain length L1 after the jig 510 is removed. This length L1 is the length of the elastic members 320 in their relaxed state, i.e., without any net external force applied thereto in their axial directions. At this time, the height H1 of the lower package 100 equals the distance from the lower surface 114 of the substrate 110 to upper ends of the elastic members 320, i.e., includes the length L1 of the elastic members in their relaxed state.

Figure 12:
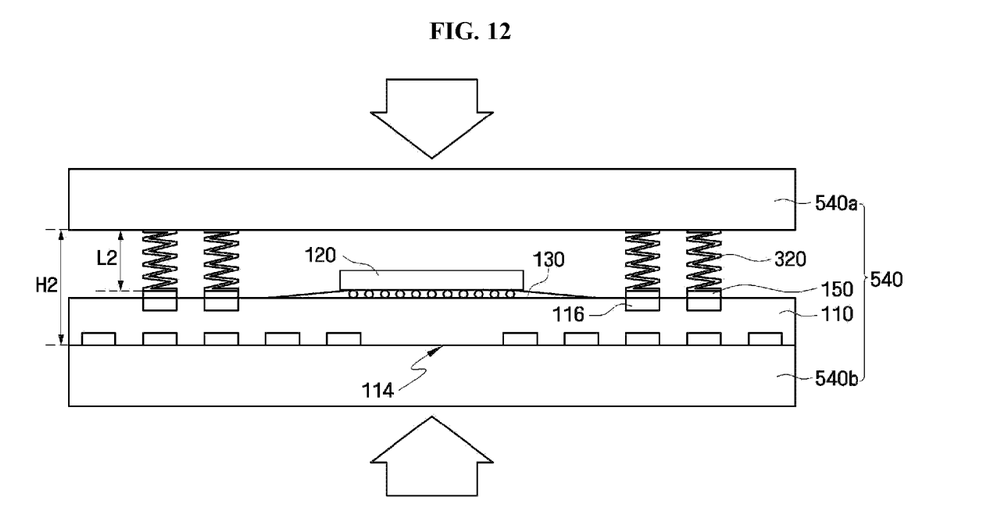

Referring to FIG. 12, the substrate 110 is placed in a mold 540. More specifically, an upper mold 540a and a lower mold 540b are placed on both sides of the substrate 110 and are moved relatively toward each other in the direction of the substrate 110 until the upper mold 540a contacts the elastic members 320 and the lower mold 540 contacts the lower surface 114 of the substrate 110. In addition, pressure is applied to the mold 540 in the direction of the substrate 110 such that the mold 540 exerts a compressive force on the elastic members 320. In other words, the upper mold 540a and the lower mold 540b are moved relatively toward each other until the elastic members 320 have a length L2 which is smaller than the length L1 of the elastic members 320 in their relaxed state. In this pressurized state, the elastic members 320 exert an elastic force on the upper mold half 540a, and the height H2 of the lower package 100 is less than the height H1 (the height of the lower package before it is placed in the mold 540).

Figure 13:
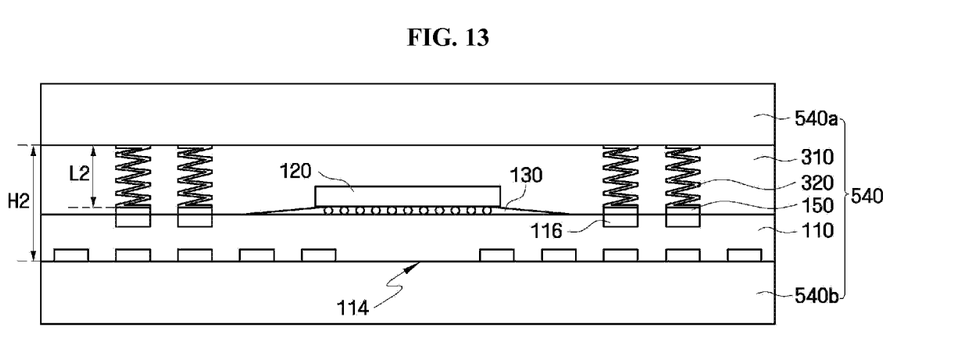

Referring to FIG. 13, the encapsulant 310 is formed by dispensing thermosetting resin such as an epoxy mold compound, for example, into the space defined between the upper space of the substrate 110 and the upper mold half 540a. As described above, at this time, the elastic members 320 exert an elastic force on the upper mold 540a half, i.e., the upper ends of the elastic members 320 are biased into contact with the upper mold half 540a. Therefore, the epoxy mold compound has a difficult time permeating between the upper ends of the elastic members 320 and the upper mold half 540a during the process in which the epoxy mold compound is being dispensed under pressure into the space between the mold halves 540a and 540b. Accordingly, this ensures that the upper end surface of each of the elastic members 320 will be exposed by the encapsulant 310. Moreover, the elastic members 320 are fixed in the encapsulant material 310 while they are compressed.

Figure 14:
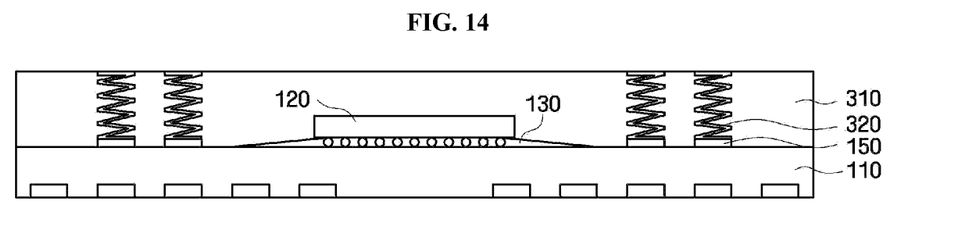

Referring to FIG. 14, the lower package is removed from the mold 540.

At this time, the upper surface of the encapsulant 310 and the exposed surfaces of the elastic members 320 are substantially coplanar because, as mentioned above, the molding process is performed in a state in which the elastic members 320 contact the upper mold half 540a However, because of its liquid nature, the epoxy mold compound may permeate between the upper mold half 540a and the elastic members 320. In this case, a thin film of the mold compound is formed over the upper end surfaces of the elastic members 320. Therefore, a planarization process may be performed to remove such a thin film and thereby expose the elastic members 320. For example, the thin film may be removed by impact the thin film over the elastic members 320 with small particles or by exposing the thin film to a chemical substance. by its a process may be optically performed to Referring back to FIG. 3, the upper package 200 is stacked on and fixed to the lower package 100. At this time, the elastic members 320 are placed in contact with the bumps 240 of the upper package 200, respectively, thereby electrically connecting the upper package 200 to the lower package. The upper package 200 may also be fixed to the lower package through the bumps 240 in the case, for example, in which the bumps are cause to reflow.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A package on package (POP) comprising:
   a first package which comprises a first substrate having a first insulating substructure and first conductive elements integral with the first insulating substructure, and a first semiconductor chip attached to the first substrate and electrically connected to respective ones of the first conductive elements; and
   a second package stacked on and fixed to the first package, and which comprises a second substrate including second insulating substructure and second conductive elements integral with the second insulating substructure, and a second semiconductor chip attached to the second substrate and electrically connected to respective ones of the second conductive elements,
   wherein the first package further comprises an encapsulant which covers the first semiconductor chip, and conductive elastic members which are embedded in the encapsulant, each of the elastic members having a part thereof exposed by the encapsulant and electrically connected to respective ones the first and second conductive elements, wherein the elastic members are helical springs.

2. The POP of claim 1, wherein the second substrate has an upper surface and a lower surface which is opposite the upper surface and faces the first package, the second semiconductor chip is attached to the second substrate at the upper surface thereof, and the conductive elements of the second substrate comprise conductive bumps at the lower surface of the second substrate, the bumps being electrically connected to the elastic members.

3. The POP of claim 2, wherein the bumps of the second package contact the parts of the elastic members exposed by the encapsulant.

4. The POP of claim 3, wherein the elastic members are members plated with conductive material.

5. The POP of claim 2, wherein the encapsulant has an upper surface which faces the second package, and each of the elastic members has a surface exposed by the encapsulant, each of the bumps contacting the surface of a respective one of the elastic members exposed by the encapsulant.

6. The POP of claim 5, wherein the surface has a planar surface having the shape of a geometrical solid.

7. The POP of claim 5, wherein the surface has the shape of at least part of an annulus.

8. The POP of claim 1, wherein the elastic members are each in an elastically compressed state within the encapsulant.

9. The POP of claim 1, wherein the elastic members each comprise a core plated with conductive material.

10. The POP of claim 1, wherein the encapsulant has an upper surface which faces the second package, and each of the elastic members has a surface exposed by the encapsulant, the exposed surface of each of the elastic members being substantially coplanar with the upper surface of the encapsulant.

11. A chip package for use as a lower package in a package on package (POP), the chip package comprising:
    a first substrate having a first insulating substructure and conductive elements integral with the first insulating substructure, and a first semiconductor chip attached to the first substrate and electrically connected to the first conductive elements;
    an encapsulant which covers the first semiconductor chip; and
    conductive elastic members which are embedded in the encapsulant, each of the elastic members having a part exposed by the encapsulant and electrically connected to respective ones the conductive elements, wherein the elastic members are helical springs.

12. The chip package of claim 11, wherein the elastic members each comprise a core plated with conductive material.

13. The chip package of claim 11, wherein the elastic members are each in an elastically compressed state within the encapsulant.

14. The chip package of claim 11, wherein the encapsulant has an upper surface, and each of the elastic members has a surface exposed by the encapsulant, the exposed surface of each of the elastic members being substantially coplanar with the upper surface of the encapsulant.

* * * * *